United States Patent
Bullied et al.

(10) Patent No.: US 8,079,400 B2
(45) Date of Patent: Dec. 20, 2011

(54) PROCESS FOR CASTING COLUMNAR GRAIN AIRFOIL WITH PREFERENTIAL PRIMARY ORIENTATION

(75) Inventors: Steven J. Bullied, Pomfret Center, CT (US); Carl R. Verner, Windsor, CT (US); Mario P. Bochiechio, Vernon, CT (US); John Joseph Marcin, Marlborough, CT (US); Kevin W. Chittenden, Newington, CT (US)

(73) Assignee: United Technologies Corporation, Hartford, CT (US)

( * ) Notice: Subject to any disclaimer, the term of this patent is extended or adjusted under 35 U.S.C. 154(b) by 294 days.

(21) Appl. No.: 12/244,203

(22) Filed: Oct. 2, 2008

(65) Prior Publication Data
US 2010/0084106 A1  Apr. 8, 2010

(51) Int. Cl.
*B22D 25/00* (2006.01)
*B22D 27/04* (2006.01)

(52) U.S. Cl. .................. 164/122.1; 164/338.1

(58) Field of Classification Search ........... 164/122.1, 164/122.2, 338.1, 361
See application file for complete search history.

(56) References Cited

U.S. PATENT DOCUMENTS

| | | |
|---|---|---|
| 3,532,155 A | 10/1970 | Kane et al. |
| 4,133,368 A | 1/1979 | Hayes |
| 4,412,577 A | 11/1983 | Salkeld et al. |
| 4,450,889 A | 5/1984 | Grot |
| 4,475,582 A | 10/1984 | Giamei et al. |
| 4,548,255 A | 10/1985 | Reiner et al. |
| 4,605,452 A | 8/1986 | Gemma et al. |
| 4,714,101 A | 12/1987 | Terkelsen |
| 5,404,930 A | 4/1995 | Stanton et al. |
| 5,611,670 A | 3/1997 | Yoshinari et al. |
| 6,244,327 B1 | 6/2001 | Frasier |
| 6,837,299 B2 * | 1/2005 | Schlienger et al. ........ 164/122.2 |
| 7,225,857 B2 | 6/2007 | Fernihough |
| 7,250,088 B2 | 7/2007 | Fernihough |
| 2004/0231822 A1 * | 11/2004 | Frasier et al. .............. 164/122.2 |

FOREIGN PATENT DOCUMENTS

| | | |
|---|---|---|
| EP | 0 171 343 A1 * | 2/1986 |
| WO | 97/46742 A1 | 12/1997 |
| WO | 03/091464 A2 | 11/2003 |

OTHER PUBLICATIONS

Extended European Search Report for EP09252356.2 mailed on Jul. 6, 2010.

* cited by examiner

*Primary Examiner* — Kevin P. Kerns
(74) *Attorney, Agent, or Firm* — Carlson, Gaskey & Olds, P.C.

(57) ABSTRACT

A molding process utilizes a seed with a columnar grain structure for defining a desired grain structure in a completed casting. The seed is received within a seed cavity of a mold. The molten material adopts the orientation of the columns defined within the seed during solidification to form a completed molded article having a desired columnar grain structure.

8 Claims, 4 Drawing Sheets

PROCESS FOR CASTING COLUMNAR GRAIN AIRFOIL WITH PREFERENTIAL PRIMARY ORIENTATION

BACKGROUND OF THE INVENTION

This disclosure generally relates a preferential grain casting process. More particularly, this disclosure describes a method and device for preferential grain casting utilizing a seed to control orientation of a columnar grain casting.

Processes for orientating a grain structure in a cast article are known to provide either a columnar structure or a single crystal structure. In such processes, a ceramic casting mold that is heated to a temperature above the melting point of the alloy is filled with molten material within a furnace. This mold is subsequently withdrawn from a hot chamber to a cold chamber of the casting furnace in a controlled manner to control solidification and obtain directional alignment of the crystals. A starter block provides a starting point for the solidification of a molten material. For a columnar grain structure, the starter block facilitates the nucleation and growth of several columns that will grow in the direction opposite of heat extraction as opposed to the formation of a random grain structure without directionality. Although a columnar grain structure is an improvement over random grain structures, the column grain structure is only orientated in one direction identified as the primary orientation. Adjacent columns would possess the same primary orientation but possess different secondary orientations denoting a crystal structure that is rotated about the primary growth axis.

Accordingly, it is desirable to design and develop a method and device for providing a preferential columnar grain structure for a cast article. A process that promotes the nucleation and growth of many directional columns is preferred to optimize mechanical properties within a cast component. Because of component and mold geometries or furnace design limitations, obtaining many directional columns that progress from the bottom to the top of the casting is not always easily achievable. In many instances, only a few columns will nucleate and grow compromising part integrity.

It is desirable to develop a method that promotes the nucleation and growth of as many directional columns as possible to optimize part integrity.

SUMMARY OF THE INVENTION

A disclosed example molding process utilizes a seed with a predetermined columnar grain structure for defining a desired grain structure in a completed casting.

The example process utilizes a mold that defines the geometric features of a molded part, such as for example an airfoil. The seed is received or embedded within a seed cavity of the ceramic mold having a plurality of preferentially orientated columns. The molten material is poured into the ceramic mold, melts a small portion of the prefabricated metal seed, and solidifies adopting the orientation of the columns defined within the seed during solidification to form a completed molded article having a desired columnar grain structure.

The example method and device provides for the preferential orientation of columnar grain structures within a completed molded article. The example columnar grain structures are defined within a seed that is received within each mold cavity prior to receiving molten metal material. The preferential defined columnar grain structure provides for tailoring of grain structure to obtain desired mechanical characteristics and properties in the completed molded article.

These and other features of the present invention can be best understood from the following specification and drawings, the following of which is a brief description.

DETAILED DESCRIPTION OF THE PREFERRED EMBODIMENT

Figure 1:
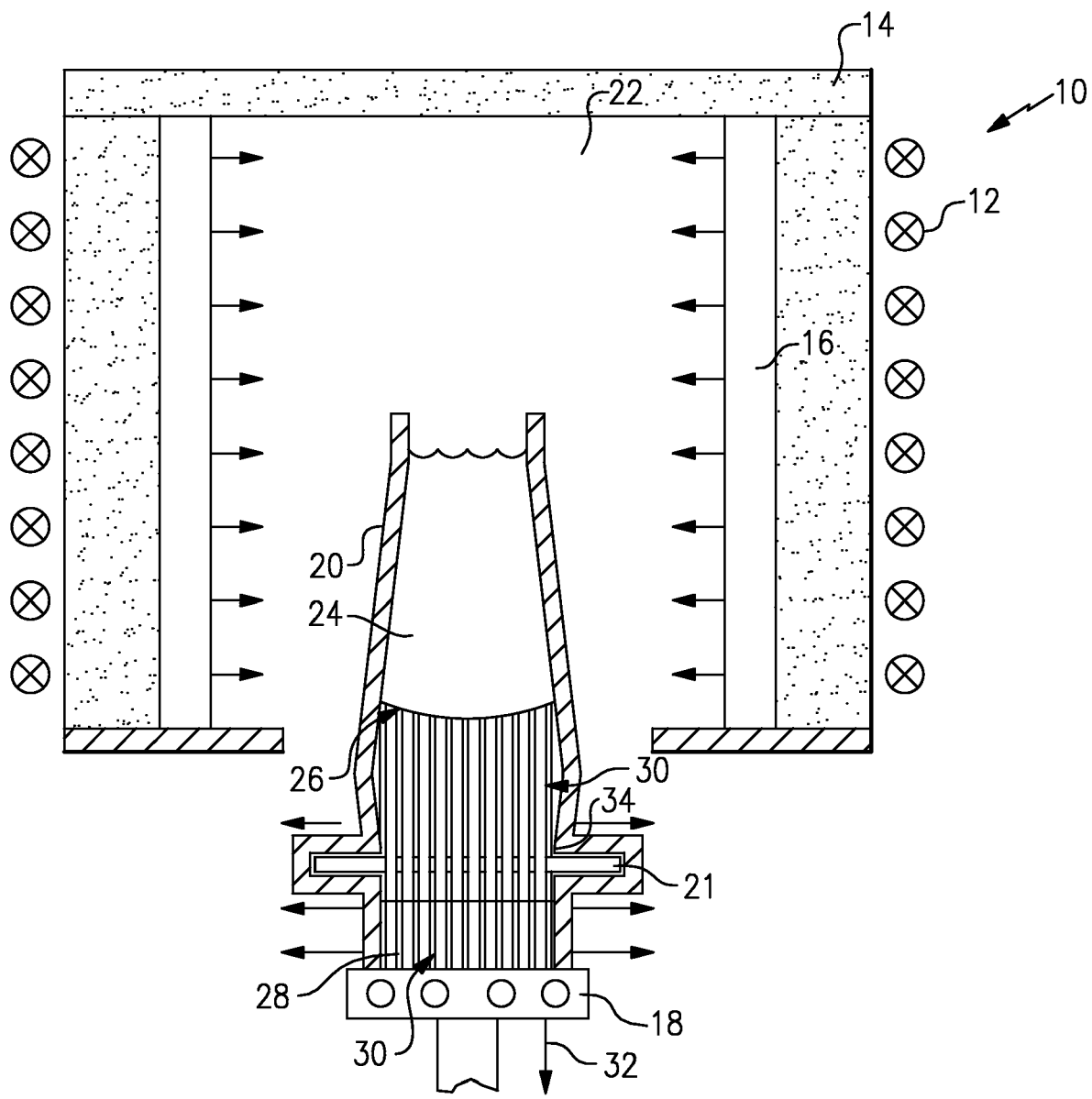
FIG. 1 is a schematic view of an example casting process.

Referring to FIG. 1, an example casting process utilizes a casting furnace assembly 10 having an induction coil 12 for heating a ceramic mold to a temperature in excess of the melting point of the alloy to be cast. The example casting assembly further includes a hot zone 22 and a susceptor 16 which translates heat from the induction coil to the ceramic casting mold 20. A lid 14 is placed on top of the hot zone to prevent the escape of heat. A ceramic mold 20 is supported on a cold chillplate 18. The cold chillplate 18 is movable out of the hot zone 22 in a direction indicated by arrow 32. A baffle 21 separates the hot zone which resides above the baffle 21 from the colder portion of the furnace into which the cast mold is withdrawn. It is within the contemplation of this disclosure that other casting furnace assembly 10 configurations could be utilized.

The mold 20 defines the geometric features of a molded part, such as for example an airfoil. A seed 28 is received within a seed cavity 34 of the mold 20. The seed 28 includes a plurality of preferentially orientated columns 30. The molten material adopts the orientation of the columns 30 defined within the seed 28 during solidification to form a completed molded article having a desired columnar grain structure.

The molding method proceeds by forming the mold 20 to define the desired geometric shape. The mold 20 is defined with the seed cavity 34 for receiving the seed 28. The seed 28 is a pre-molded block having the desired columnar grain structure. The seed 28 comprises similar material content and mixture as is utilized to cast the article. The material comprising the seed 28 can be identical to that of the molten material for the cast article. Further, the seed 28 could be fabricated from a metallic material or composite material similar, but different than the material utilized for the cast article. As appreciated, any material or composite utilized for the seed 28 is selected to provide the desired results and compatibility in view of the material utilized for the cast article.

The solid seed 28 is inserted into the seed cavity 34 prior to the introduction of molten metal and prior to insertion of the mold 20 within the furnace assembly 10. With the seed 28 disposed within the mold 20, the mold 20 is placed within the hot zone 22. Molten material is then poured into the mold 20. The molten material 20 remains in a molten state within the hot zone 22. The seed 28 comes into contact with the molten material and partially melts at the interface with the molten material.

Once the mold 20 is filled, it is removed from the hot zone 22 into a cooler environment that provides for solidification of the molten material 24. The mold 20 is supported on the cold plate 18. The example cold plate 18 is supported for movement out of the hot zone 22 in a controlled manner to control the solidification of the molten material. A solidification front 26 forms as the mold 20 is lowered from the hot zone 22. The solidified material adopts the columnar orientations and structure of the seed 28. The columnar orientations are defined by those created and defined in the seed 28. The orientation of the grains within the completed molded article is thereby defined by the columnar structure fabricated into the seed 28.

Figure 2:
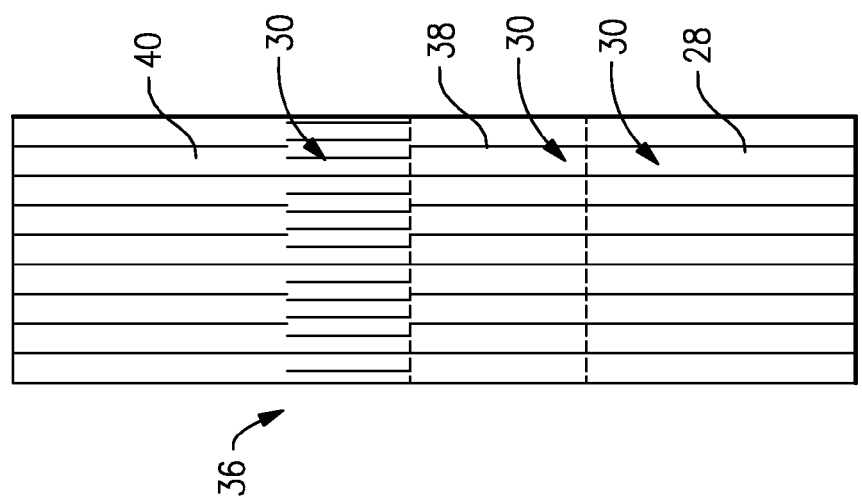
FIG. 2 is a sectional view of an example columnar grain structure.

Referring to FIG. 2 with continued reference to FIG. 1, a section 36 is shown that illustrates the interface between the seed 28 and the molded article. The seed 28 is shown with defined columns 30. Upon exposure to the molten material, a portion of the seed 28 melts back and forms a mixed zone 38. In the mixed zone 38 the added molten material 24 (FIG. 1) mixes with a portion of the seed 28. Upon solidification, the material from the original seed 28 freezes in a mixture with the molten material. It is in this mixed zone 38 that the columnar grain structure and orientation is adopted by the solidifying molten material.

The molded article 40 includes the columnar structure 30 that was defined in the original seed 28. This columnar structure 30 includes fine dendritic structures to start the growth of columnar structures within the molten material. The columnar structures are numbered and orientated to provide the desired strength, durability or other mechanical properties desired in the completed molded article. Additional mechanical properties that can be defined and provided by the example process includes durability, fatigue strength, dampening and also the preferential orientation of stresses on the completed part.

Figure 3:
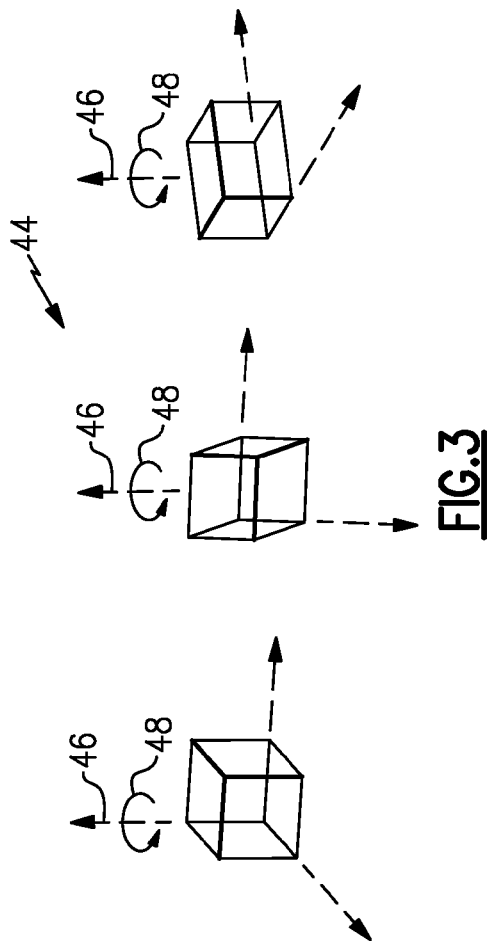
FIG. 3 is schematic view of an orientation of an example columnar grain.

Referring to FIG. 3, several columns 30 of grained structures is schematically depicted as blocks 44. Each of the grained structures 44 are vertically orientated along a vertical axis 46. Further, the grained structures 44 are commonly orientated in a rotational direction indicated by arrow 48 about the vertical axis 46. The orientations vertically along the axis 46 and rotationally is provided by the orientations defined in the columnar grained seed 28. Each block 44 defines the orientation of one column 30.

Figure 4:
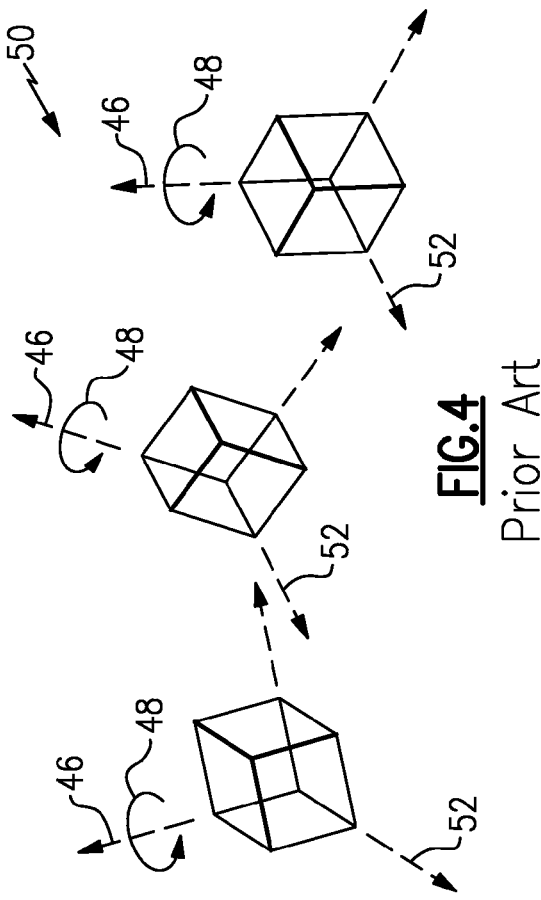
FIG. 4 is a schematic view of a prior art equiax grain structure.

Referring to FIG. 4, a prior art equiax grain structure 50 is schematically illustrated and includes a grain structure where the grains possess different primary and secondary orientations. Each adjacent column represented by the block is facing a different rotational direction as indicated by arrows 52.

Figure 5:
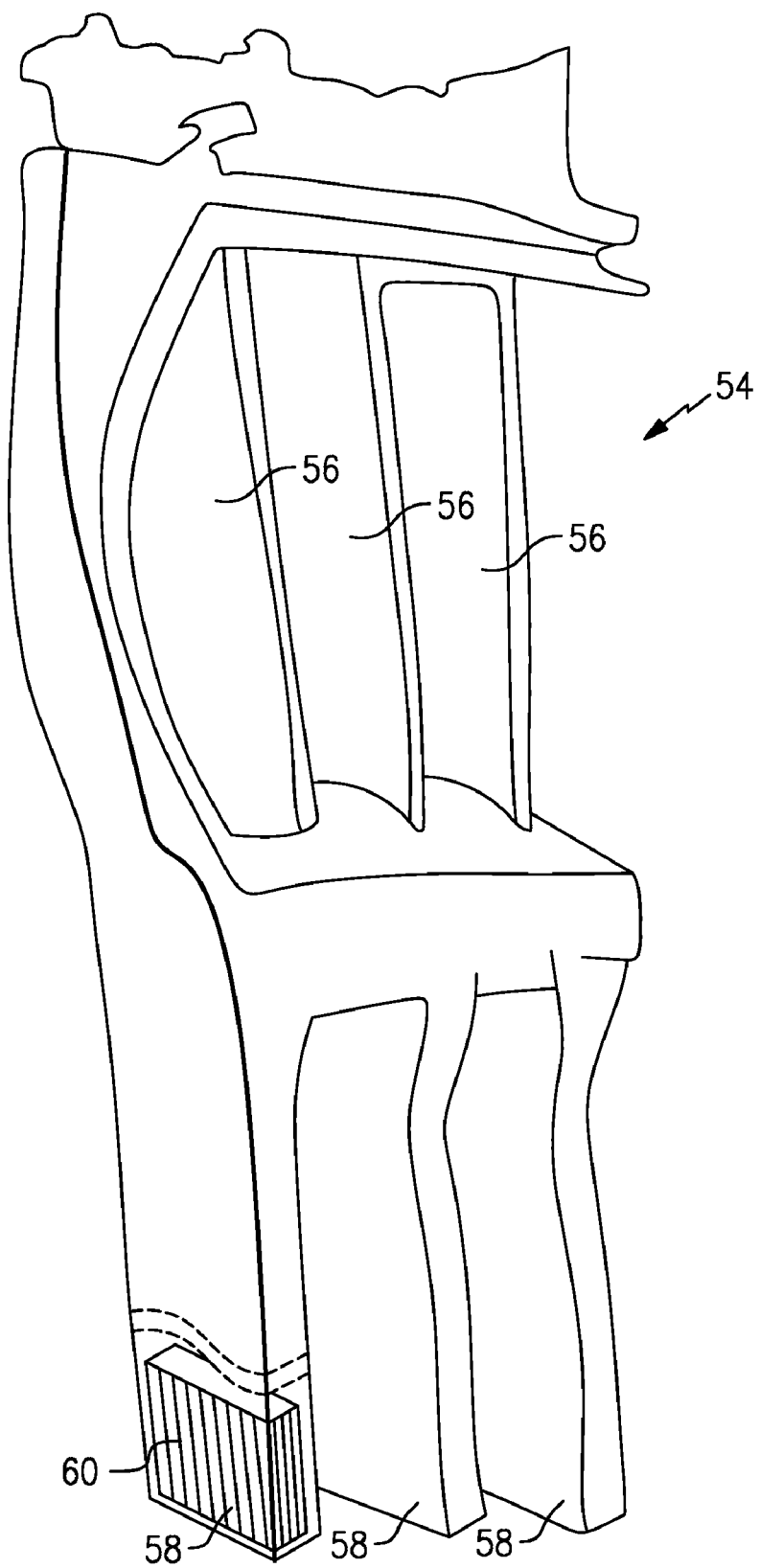
FIG. 5 is a schematic view of an example casting.

Referring to FIG. 5, an example mold 54 for the fabrication of an airfoil such as a turbine vane includes several cavities 56. Each cavity 56 defines the geometry and shape of a completed turbine blade. All the cavities 56 are in communication such that molten material flows to each cavity from a common inlet. Each of the cavities 56 includes a seed cavity portion 58. Once of the example seed cavities 58 are partially sectioned to show an example seed 60 received therein. The seed 60 is cast, solidified and heat-treated prior to insertion into the seed cavity 58. The casting process of the seed 60 provides the desired columnar grain orientations that are to be adopted by the completed turbine blade.

The seed 60 includes a size that corresponds with each individual cavity 56. The seed 60 is as wide or wider than the corresponding cavity 56 to provide for columnar growth in a vertical manner without disruptions. Further, the height of the seed 60 is such that upon encountering the molten material, at least some portion of the seed 60 will remain in a solid form. The height of the seed 60 is therefore provided such that sufficient original solidified material with the defined grain structure survives the molding and solidification process.

Figure 6:
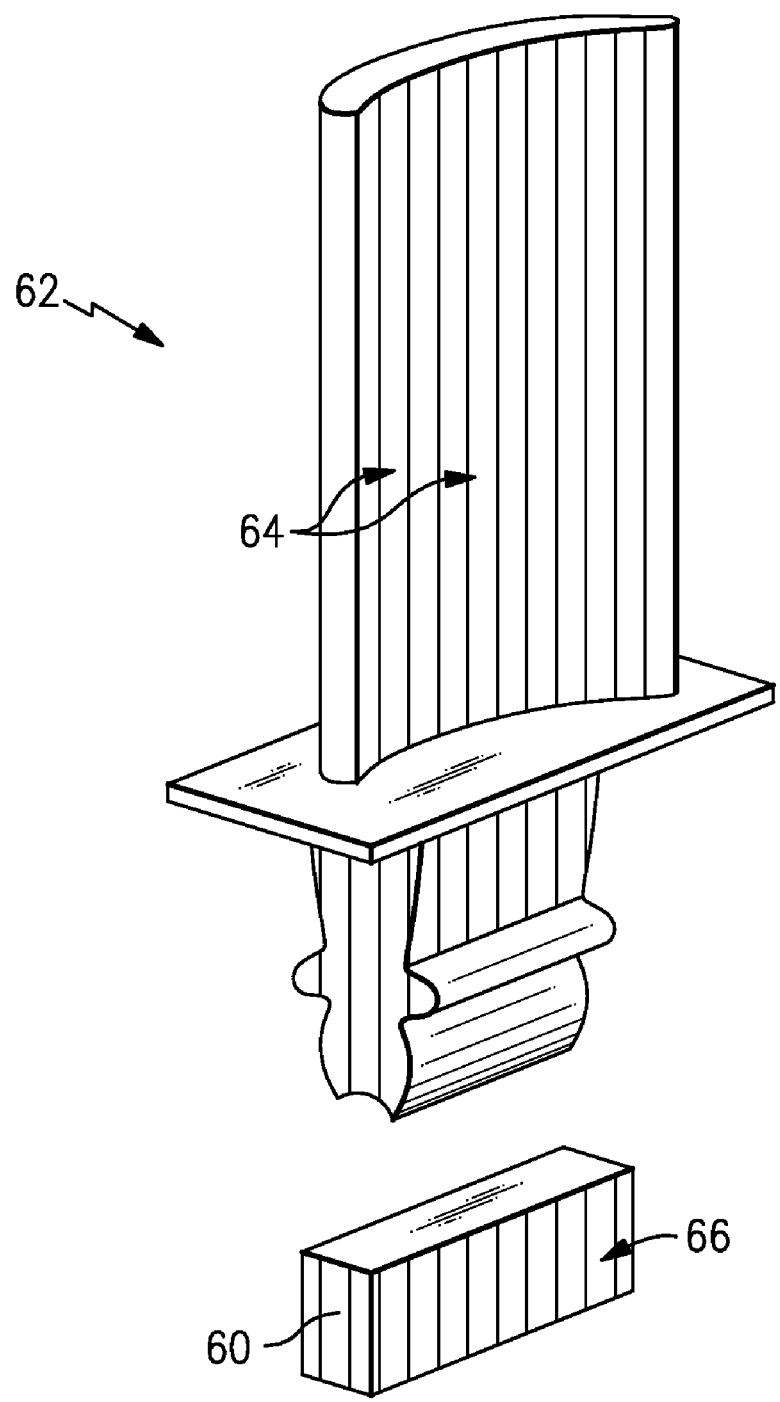
FIG. 6 is perspective view of an example airfoil including a columnar grain structure.

Referring to FIG. 6, an example turbine blade assembly 62 includes a columnar grain structure with columns 64 throughout. The columns 64 within the blade assembly 62 are uniform and generated by columns 66 defined by the seed 60. After the molding process is complete and the blade assembly 62 has solidified, the seed 60 is removed by a machining process as is known.

The example method and device provides for the preferential orientation of columnar grain structures within a completed cast article. The example columnar grain structures are defined within a seed that is received within each mold cavity prior to receiving molten metal material. The preferential defined columnar grain structure provides for tailoring of grain structure to obtain desired mechanical characteristics and properties in the completed molded article.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A method of forming a cast article comprising:
    forming a mold cavity including a desired shape of a completed cast article, the mold cavity open to a seed cavity through a bottom opening, a width of the bottom opening and the seed cavity being substantially equal to a width of the mold cavity;
    inserting a seed within the seed cavity, the seed including a plurality of columns that each define a primary columnar grain orientation, wherein the seed is aligned with the bottom opening and is defined to include a width substantially equal to the width of the mold cavity;
    filling the mold cavity with a molten material in a heated environment;
    removing the mold cavity from the heated environment to solidify the molten material; and
    forming a plurality of columnar grains within the cast article that each include a primary grain orientation that corresponds to the plurality of columns that are defined by the seed such that each of the plurality of columnar grains formed in the cast article include substantially the same primary columnar grain structure defined by a corresponding one of the plurality of columns of the seed with the molten material during solidification.

2. The method as recited in claim 1, wherein the rotational orientation of the preferred grain orientation is uniform along the vertical length of the completed molded article.

3. The method as recited in claim 1, wherein a rate of solidification is controlled by controlling a rate of removal of the mold cavity from the heated environment.

4. The method as recited in claim 1, including the step of defining a height of the seed to include material sufficient to maintain at least a portion of the original seed upon exposure to molten material.

5. A method of casting an airfoil comprising;
    forming a mold cavity including a desired shape of the airfoil with a bottom opening open to a seed cavity, the bottom opening and the seed cavity substantially as wide as the mold cavity;
    inserting a seed within the seed cavity, the seed including a plurality of columns including a primary grain structure for defining a desired columnar grain orientation for a plurality of columns formed in a completed airfoil, wherein the seed is at least as wide as the seed cavity and the bottom opening;

filling the mold cavity with a molten material in a heated environment;

removing the mold cavity from the heated environment to solidify the molten material; and forming a plurality of columns in the airfoil with each of the plurality of columns including a primary grain structure as defined by the seed with the molten material during solidification.

6. The method as recited in claim 5, wherein the primary orientation includes a vertical orientation defined along an axis and a secondary orientation comprises a rotational orientation about the axis.

7. The method as recited in claim 5, wherein the seed comprises a solidified bar of material common to the molten material.

8. The method as recited in claim 5, wherein the seed comprises one of a metallic material and a composite material of a different composition than the molten material.

* * * * *